(12) United States Patent
Manabe et al.

(10) Patent No.: US 9,160,958 B2
(45) Date of Patent: Oct. 13, 2015

(54) METHOD OF READING OUT AN IMAGE SENSOR WITH TRANSFER GATE BOOST

(71) Applicant: OMNIVISION TECHNOLOGIES, INC., Santa Clara, CA (US)

(72) Inventors: Sohei Manabe, San Jose, CA (US); Jeong-Ho Lyu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 196 days.

(21) Appl. No.: 14/133,127

(22) Filed: Dec. 18, 2013

(65) Prior Publication Data

US 2015/0172579 A1 Jun. 18, 2015

(51) Int. Cl.
*H04N 5/378* (2011.01)
*H04N 5/3745* (2011.01)
*H01L 27/146* (2006.01)

(52) U.S. Cl.
CPC .......... *H04N 5/378* (2013.01); *H01L 27/14641* (2013.01); *H04N 5/37455* (2013.01)

(58) Field of Classification Search
CPC ............... H04N 5/378; H04N 5/37455; H01L 27/14641; H01L 27/14643
USPC .................. 250/208.1; 257/290–292; 348/308
See application file for complete search history.

(56) References Cited

U.S. PATENT DOCUMENTS

| | | | |
|---|---|---|---|
| 6,133,563 A | 10/2000 | Clark et al. | |
| 8,159,585 B2 | 4/2012 | Parks et al. | |
| 8,319,307 B1 | 11/2012 | Williams | |
| 8,576,292 B2 | 11/2013 | Wright et al. | |
| 2003/0103153 A1* | 6/2003 | Fossum | H01L 27/14609 348/308 |
| 2006/0146161 A1 | 7/2006 | Farrier | |
| 2006/0208936 A1* | 9/2006 | Boemler | H03M 1/46 341/155 |
| 2006/0227233 A1* | 10/2006 | Fossum | H01L 27/14609 348/308 |
| 2013/0256768 A1 | 10/2013 | Theuwissen | |

* cited by examiner

*Primary Examiner* — Seung C Sohn
(74) *Attorney, Agent, or Firm* — Blakely Sokoloff Taylor & Zafman LLP

(57) ABSTRACT

An image sensor includes photosensitive regions, transfer transistors, and one or more shared charge-to-voltage mechanism. A method for reading out the image sensor includes enabling a first transfer transistor to transfer photo-generated charge from a first photosensitive region to a shared charge-to-voltage mechanism. The method also includes no more than partially enabling a second transfer transistor to partially turn on the second transfer transistor to increase a capacitance of the shared charge-to-voltage mechanism while the photo-generated charge is transferred from the first photosensitive region to the shared charge-to-voltage mechanism.

19 Claims, 4 Drawing Sheets

METHOD OF READING OUT AN IMAGE SENSOR WITH TRANSFER GATE BOOST

BACKGROUND INFORMATION

1. Field of the Disclosure

This disclosure relates generally to the reading out of image sensors, and in particular but not exclusively, relates to the reading out of image sensors that include shared charge-to-voltage conversion mechanisms.

2. Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors.

CMOS image sensors can use arrays of pixels. A pixel generally includes a photodiode (i.e., a photo-sensitive region responsible for collecting electromagnetic energy and converting the collected electromagnetic energy into electrons), a transfer transistor, a source follower amplifier transistor, and a row select transistor. Photo-generated charge accumulated in the photosensitive region of the photodiode is ultimately converted into a voltage by a charge-to-voltage mechanism (also referred to as a floating diffusion) included in the pixel.

Some image sensors may include a shared pixel architecture, where photodiodes are grouped together to form pixel units that have a shared charge-to-voltage mechanism, as well as one or more shared transistors, among several photodiodes.

The efficiency with which the photosensitive regions of a pixel unit converts incident electromagnetic energy into accumulated electrons depends on many factors, including the full well capacity (FWC) of the photodiodes. FWC is a measure of the number of electrons a photodiode can store before it reaches saturation. When the saturation of a photodiode is reached, excess electrons may overflow to adjacent pixels. Increased photodiode FWC may result in a higher dynamic range and higher signal-to-noise ratio for a CMOS sensor, which ultimately results in higher-quality digital images.

However, an increase in the photodiode FWC may result in an increase in the occurrence of "black dots" in the resultant image. This is because an increased FWC would require a charge-to-voltage conversion region that is reset to a larger voltage to accommodate a larger voltage swing. This larger voltage potential on the charge-to-voltage mechanism may cause one or more of the pixel transistors (e.g., source-follower transistor) to operate outside of its linear operation region. The non-linear operation of the source follower transistor may cause a signal level, in low light conditions (i.e., high voltage on the floating diffusion), to be compressed which results in the increased occurrence of the black dots.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
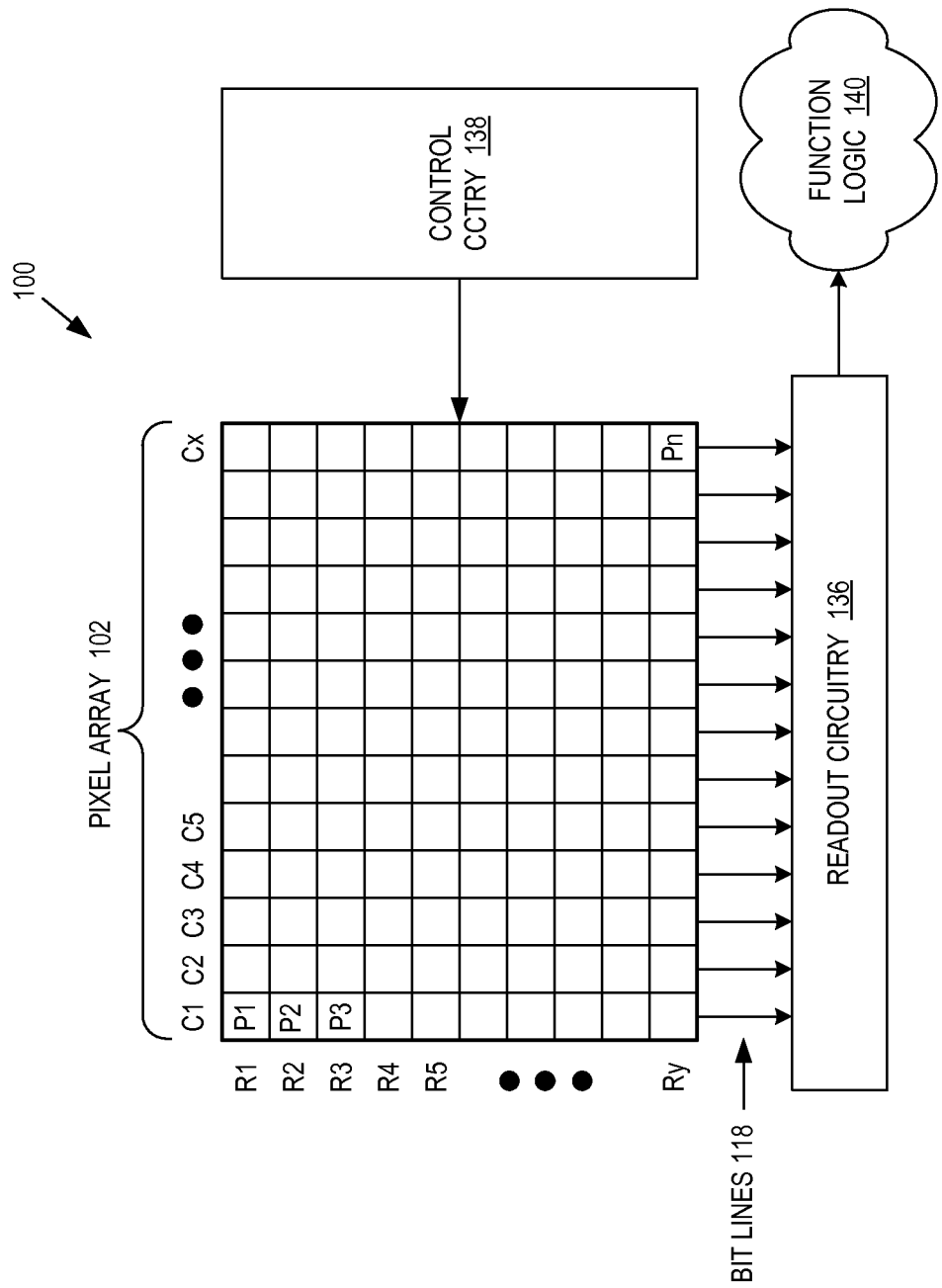
FIG. 1 is a block diagram illustrating an image sensor, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present disclosure describe an image sensor readout method that increases a capacitance of the charge-to-voltage conversion mechanism without the need for additional circuitry or components in the pixel cells. In one example, an image sensor includes photosensitive regions, transfer transistors, and one or more shared charge-to-voltage mechanisms. One embodiment for reading out such an image sensor includes enabling a first transfer transistor to transfer photo-generated charge from a first photosensitive region to the shared charge-to-voltage mechanism. To increase the capacitance of the charge-to-voltage mechanism while the photo-generated charge is transferred, a second transfer transistor coupled to the shared charge-to-voltage mechanism is partially enabled to partially turn on the second transfer transistor. The partial turn on of the second transfer transistor adds a coupling (i.e., parasitic) capacitance of the second transfer transistor to the shared charge-to-voltage mechanism. Increasing the total capacitance of the charge-to-voltage mechanism during readout may allow for an increased reset voltage, and/or increased full well capacity (FWC) photodiode, without significant increases in the occurrence of black dots. These and other examples will be described in more detail below.

FIG. 1 is a block diagram illustrating an example imaging system 100 including a pixel architecture and readout method that has an increased photodiode FWC and reduced occurrence of black dots in accordance with the teachings of the present invention. As shown in the depicted example, imaging system 100 includes pixel array 102 coupled to control circuitry 138 and readout circuitry 136, which is coupled to function logic 140.

In one example, pixel array 102 is a two-dimensional (2D) array of imaging sensors or pixel cells (e.g., pixel cells P1, P2 . . . , Pn). As illustrated, each pixel cell is arranged into a row (e.g., rows R1 to Ry) and a column (e.g., column C1 to Cx) to acquire image data of a person, place, object, etc., which can then be used to render a 2D image of the person, place, object, etc.

In one example, after each pixel cell has accumulated its image data or image charge, the image data is read out by readout circuitry 136 through readout column bit lines 118 and then transferred to function logic 140. In various examples, readout circuitry 136 may also include additional amplification circuitry, additional analog-to-digital (ADC) conversion circuitry, or otherwise. Function logic 140 may simply store the image data or even manipulate the image data by applying post image effects (e.g., crop, rotate, remove red eye, adjust brightness, adjust contrast, or otherwise). In one example, readout circuitry 136 may readout a row of image data at a time along readout column bit lines 118 (illustrated) or may readout the image data using a variety of other techniques (not illustrated), such as a serial readout or a full parallel readout of all pixels simultaneously.

Figure 2A:
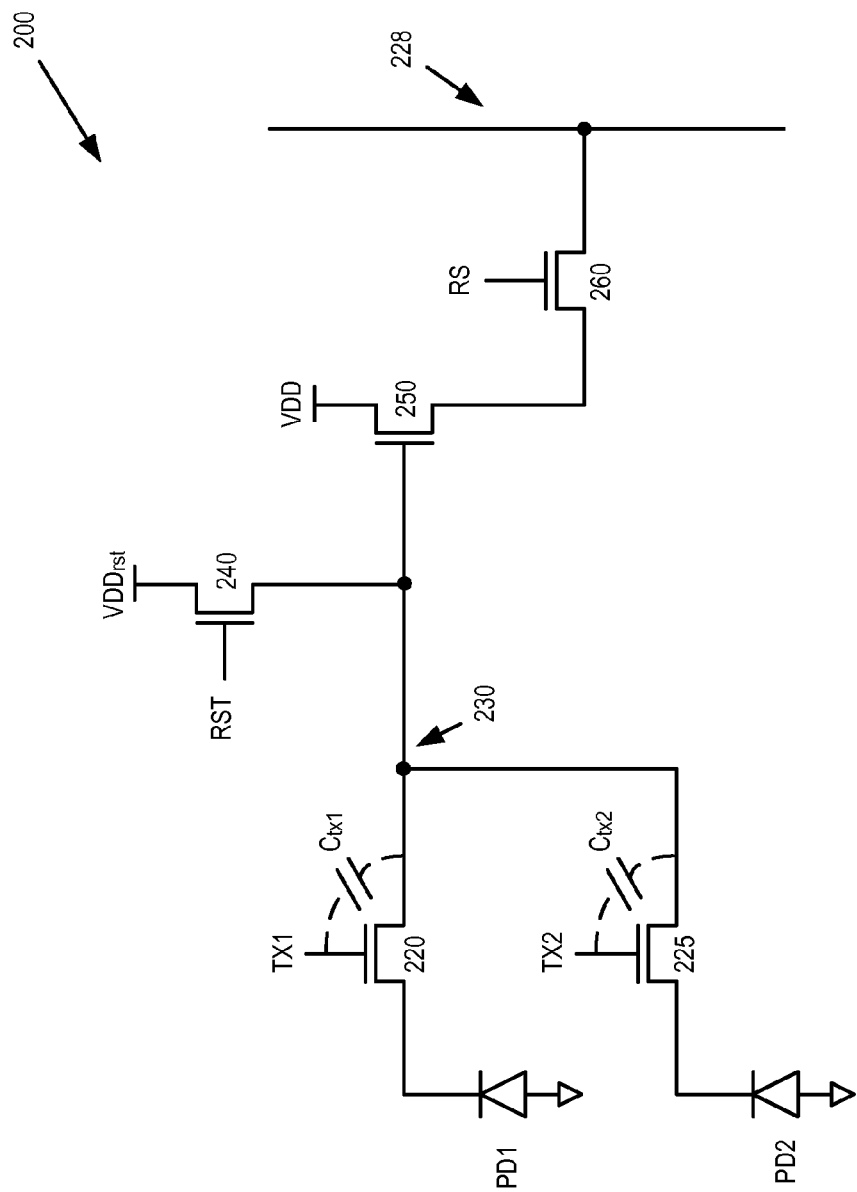
FIG. 2A is a schematic illustrating a pixel unit having two photodiodes and a shared charge-to-voltage conversion mechanism, in accordance with the teachings of the present disclosure.

FIG. 2A is a schematic illustrating a pixel unit 200 having two photodiodes and a shared charge-to-voltage conversion mechanism 230, in accordance with the teachings of the present disclosure. Pixel unit 200 is one possible portion of pixel array 102 of FIG. 1. Pixel unit 200 includes first and second photosensitive regions (or photodiodes) PD1 and PD2, respectively, first and second transfer transistors 220 and 225, respectively, readout column bit line (or bitline) 228, a shared charge-to-voltage mechanism (or floating diffusion node) 230, reset transistor 240, source follower transistor 250, and row select transistor 260.

Each of first and second transfer transistors 220 and 225 are coupled to first and second photodiodes PD1 and PD2, respectively and to floating diffusion node 230, as seen in FIG. 2A. A first and second transfer signal TX1 and TX2 are respectively applied to the gate terminal of first and second transistor transistors 220 and 225, as will be described below. Reset transistor 240 is coupled between reset voltage source $VDD_{rst}$ and floating diffusion node 230. Source follower transistor 250 and row select transistor 260 are connected in series between power supply VDD and bit line 228, as seen in FIG. 2A.

In one embodiment, the readout of pixel unit 200 begins when reset transistor 240 is enabled, or set to an active state. When reset transistor 240 is enabled, floating diffusion node 230 is coupled to reset voltage source $VDD_{rst}$ and a reset voltage is applied to the floating diffusion node 230. Source follower transistor 250 then amplifies the reset voltage at floating diffusion node 230 when row select signal RS is asserted to the gate terminal of row select transistor 260. A reset sample signal SHR (not shown in FIG. 2A) is then asserted in a sample and hold circuit (not shown) coupled to bit line 228 to sample the reset voltage, which may be subsequently used for correlated double sampling.

Next, during an integration period, first and second photodiodes PD1 and PD2 are exposed to electromagnetic energy, such as when an image is taken in a camera or smart phone and a shutter of the camera or smart phone is open. In response to the exposure of electromagnetic energy, first and second photodiodes PD1 and PD2 produces a photo-generated charge. At the end of the integration period, the transfer signal TX1 is asserted to enable to the first transfer transistor 220. When transfer transistor 220 is enabled, the photo-generated charge in first photodiode PD1 is transferred to floating diffusion node 230, which then converts the transferred charge into an analog image voltage.

During the first transfer period, while first transfer signal TX1 is asserted, a boost transfer voltage $V_{txm}$ is applied to the gate terminal of second transfer transistor 225. Boost transfer voltage $V_{txm}$ has a voltage level that is less than that of the threshold voltage of second transfer transistor 225, so that the second transfer transistor 225 is only partially enabled. When the second transfer transistor 25 is only partially enabled, accumulated electrons from second photodiode PD2 will not be transferred to floating diffusion node 230. Instead, a coupling capacitance $C_{tx2}$ of the second transfer transistor 225 is added to the total capacitance of the floating diffusion node 230.

Thus, embodiments disclosed herein take advantage of the coupling capacitance $C_{tx1}$ and $C_{tx2}$ between the gate terminal of each of first and second transfer transistor 220 and 225, and floating diffusion node 230. The coupling capacitance of the transfer transistors is a parasitic capacitance that arises by applying the boost transfer voltage. Therefore, the coupling capacitance of the non-transferring transfer transistor can be added to the total capacitance of floating diffusion node 230 during the transfer of charge.

After the first transfer period, source follower transistor 250 amplifies the image voltage which is provided to bit line 228 through row select transistor 260. Reset image signal, SHS, is asserted in the sample and hold circuit (not shown), coupled to bit line 228 to sample the image voltage, which may be used for correlated couple sampling. Pixel units arranged in the same column may be coupled to the same bit line via row select transistor 260. In the illustrated embodiment of the invention, row select transistor 260 selectively couples source follower transistor to bit line 228. In other embodiments of the invention, row select transistor 260 may be omitted.

Figure 2B:
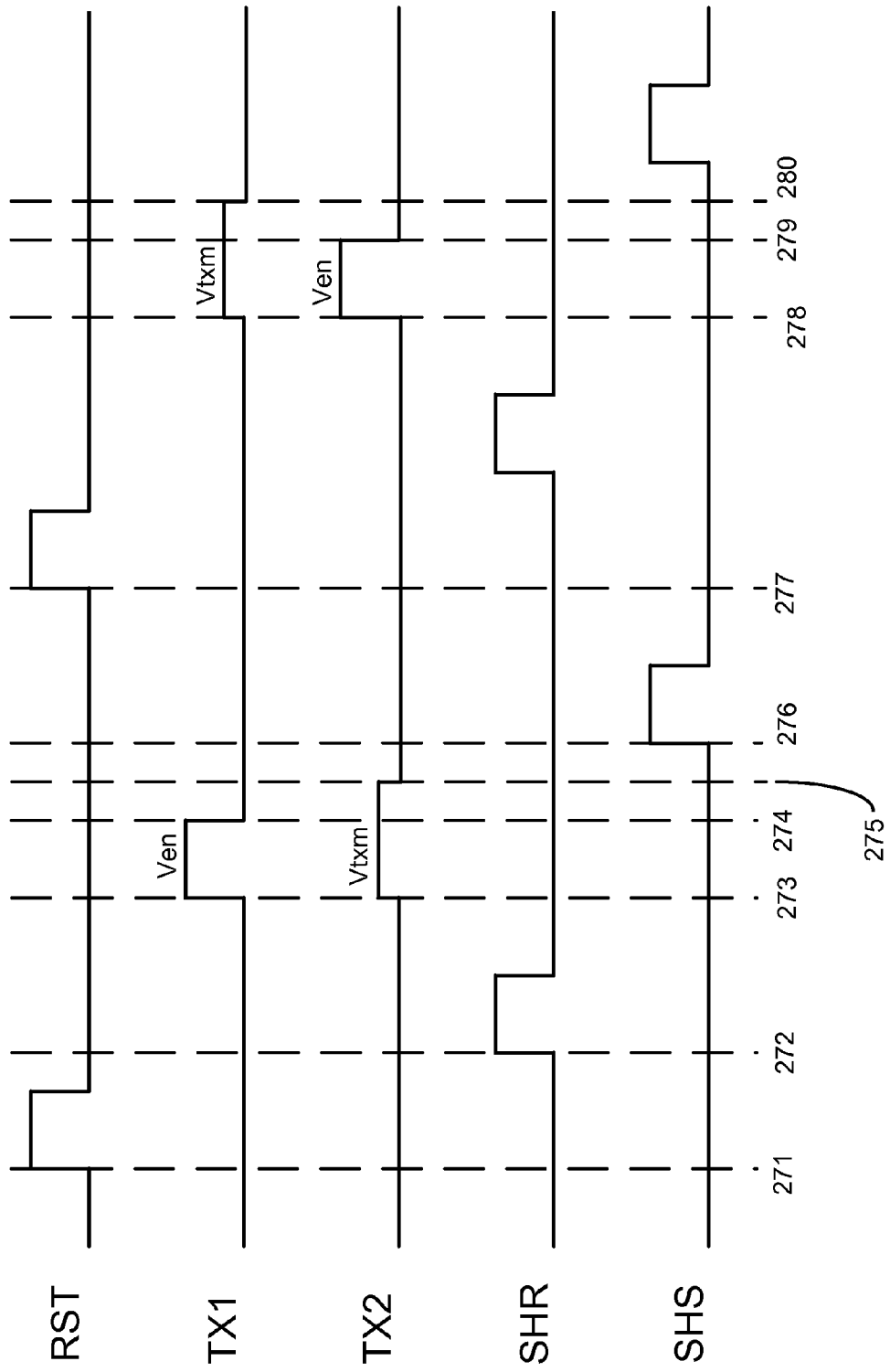
FIG. 2B is a timing diagram illustrating example signals for reading out of a shared pixel architecture, in accordance with the teachings of the present disclosure.

FIG. 2B is a timing diagram illustrating example signals for reading out of a shared pixel architecture, in accordance with the teachings of the present disclosure. At time 271, reset signal RST is asserted to enable the reset transistor 240. At this time, floating diffusion node 230 is set to a reset voltage, which has a voltage level of approximately $VDD_{rst}$. At time 272, reset sample signal, SHR, is asserted in a sample and hold circuit (not shown), which is coupled to bit line 228 to sample the reset voltage. At time 273, transfer signal TX1 is asserted, by applying an enable voltage $V_{en}$ to the gate terminal of first transfer transistor 220. At the same time, boost transfer voltage $V_{txm}$ is applied to the gate terminal of second transfer transistor 225 to partially enable (i.e., partially turn on) second transfer transistor 225.

Photo-generated charge from first photodiode PD1 is transferred to floating diffusion node 230 with the first transfer transistor 220 enabled. Boost transfer voltage has a voltage level that is less than that of the threshold voltage of second transfer transistor 225, so accumulated electrons from second photodiode PD2 will not be transferred to floating diffusion node 230 until a second transfer period. At time 274, transfer signal TX1 is de-asserted to disable the first transfer transistor 220. At this point, accumulated electrons from photodiode PD1 will no longer be transferred to floating diffusion node 230. However, boost transfer voltage $V_{tmx}$ is maintained on the gate of second transfer transistor 225 until time 275, to continue to add the additional coupling capacitance, $C_{tx2}$ to the total capacitance of floating diffusion node 230 for a period of time after transfer signal TX1 is de-asserted. In one embodiment, the time period that the first transfer transistor is enabled, between time 273 and 274, is at least several hundred nanoseconds, while the time delay between time 274 and 275 is at least ten nanoseconds. As can be seen in the example of FIG. 2B, both the time period that the first transfer transistor 220 is enabled and the time period that the second transfer transistor 225 is partially enabled have a beginning that substantially coincide at time 273. Subsequently, at time 276, reset image signal SHS is asserted in a sample and hold circuit (not shown), which is coupled to bit line 228 to sample the image voltage.

At time 277, reset signal RST is again asserted to apply the reset voltage to the floating diffusion node 230. After asserting the reset sample signal, SHR, to assert the sample and hold circuit to sample the reset voltage, transfer signal TX2 is asserted at time 278 by applying an enable voltage $V_{en}$ to the gate terminal of second transfer transistor 225 to enable the second transfer transistor 225. Accumulated electrons from second photodiode PD2 are then transferred to floating diffusion node 230. At the same time 278, boost transfer voltage $V_{txm}$ is applied to the gate terminal of first transfer transistor 220 to only partially enable the first transfer transistor 220. When first transfer transistor 220 is only partially enabled, accumulated electrons from first photodiode PD1 will not be transferred to floating diffusion node 230. At time 279, transfer signal TX2 is de-asserted to disable the second transfer transistor 225. At this point, accumulated electrons from photodiode PD2 will no longer be transferred to floating diffusion node 230. Boost transfer voltage $V_{tmx}$ is maintained on the gate of the first transfer transistor 220 a delay time after the second transfer transistor 225 is disabled, until time 280, to keep the additional coupling capacitance $C_{tx1}$ added to the total capacitance of floating diffusion node 230.

Figure 3:
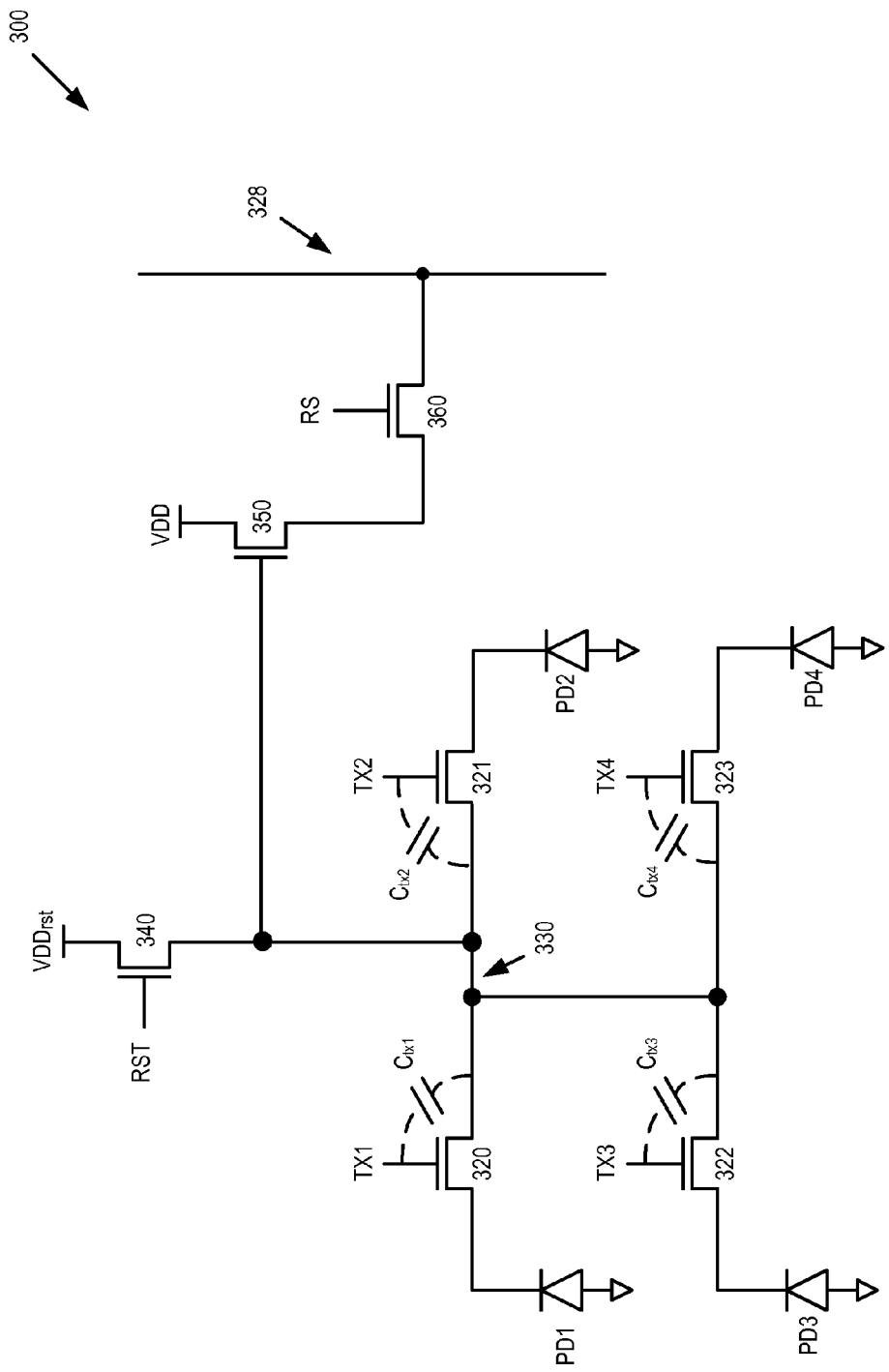
FIG. 3 is a schematic illustrating a pixel unit having four photodiodes and a shared charge-to-voltage conversion mechanism, in accordance with the teachings of the present disclosure.

FIG. 3 is a schematic illustrating a pixel unit 300 having four photodiodes and a shared charge-to-voltage conversion mechanism 330, in accordance with the teachings of the present disclosure. Pixel unit 300 includes a first, a second, a third and a fourth photodiode (310, 311, 312 and 313), first, second, third and fourth transfer transistors 320, 321, 322 and 323 respectively, reset transistor 340, source follower transistor 350 and row select transistor 360.

Each of first, second, third and fourth transfer transistors 320, 321, 322 and 323 are coupled to first, second, third and fourth photodiodes PD1, PD2, PD3, and PD4, respectively and floating diffusion node 330, as seen in FIG. 3. A first, second, third and fourth transfer signal TX1, TX2, TX3 and TX4 are selectively applied to the gate terminals of first, second, third, and fourth transfer transistors 320, 321, 322 and 323. Similar to the pixel unit 200 of FIG. 2A, reset transistor 340 is coupled between reset voltage source VDDrst and floating diffusion node 330. Source follower transistor 350 and row select transistor 360 are connected in series between power supply VDD and bit line 328.

Similar to the readout of the pixel unit 200 of FIG. 2A, during a first transfer period, while transfer signal TX1 is asserted, a boost transfer voltage $V_{txm}$ is applied to the gate terminal of second, third and fourth transfer transistors 321, 322 and 323. Boost transfer voltage $V_{txm}$ has a voltage level that is less than that of the threshold voltage of each of four transfer transistors, since in one embodiment, all transfer transistors of an image sensor may have substantially the same threshold voltage. Photo-generated charge from the non-transferring photodiodes (i.e., PD2, PD3, and PD4) will not be transferred to floating diffusion node 230 until their respective transfer period. However, applying the boost transfer voltage $V_{txm}$ to each of the transfer transistors 321, 322, and 323, will add their respective coupling capacitances (i.e., $C_{tx2}$, $C_{tx3}$, and $C_{tx4}$) to the total capacitance of floating diffusion node 330.

Similarly, during a second transfer period, while transfer signal TX2 is asserted, the boost transfer voltage $V_{txm}$ is applied to the gate terminal of the first, third and fourth transfer transistors (320, 322, and 323). During a third transfer period, while transfer signal TX3 is asserted, the boost transfer voltage $V_{txm}$ is applied to the gate terminal of the first, second and fourth transfer transistors (320, 321, and 323). During a fourth transfer period, while transfer signal TX4 is asserted, the boost transfer voltage $V_{txm}$ is applied to the gate terminal of the first, second and third transfer transistors (320, 321, and 322).

In the embodiment of FIG. 3, during one transfer period, one transfer signal is asserted, while the boost transfer voltage is applied to the gate terminal of the remaining three transfer transistors to only partially enable the remaining three transfer transistors. In other embodiments of the invention, during one transfer period while one transfer signal is asserted, the boost transfer voltage may be applied to only one or two of the remaining three transfer transistors.

Accordingly, the embodiment of FIG. 3 takes advantage of the coupling capacitances $C_{tx1}$, $C_{tx2}$, $C_{tx3}$ and $C_{tx4}$, between the gate terminal of each of first, second, third and fourth transfer transistors 320, 321, 322 and 323, and floating diffusion node 330. By applying the boost transfer voltage, the coupling capacitance of the non-transferring transfer transistor(s) will be added to the total capacitance of floating diffusion node 330.

Although, FIG. 2A illustrates a pixel unit with two photodiodes, and FIG. 3 illustrates a pixel unit with four photodiodes, embodiments of the present disclosure may be used for reading out an image sensor that includes other shared pixel architecture, such as eight-share or sixteen-share pixel units. For each of the transfer transistors in the shared pixel cells, one transfer signal is asserted, while the boost transfer voltage is applied to anywhere between one to all of the remaining non-transferring transfer transistors.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A method for reading out an image sensor having a first photosensitive region, a second photosensitive region, a shared charge-to-voltage mechanism, a first transfer transistor disposed to selectively couple the first photosensitive region to the shared charge-to-voltage mechanism, and a second transfer transistor disposed to selectively coupled the second photosensitive region to the shared charge-to-voltage mechanism, the method comprising:
   enabling the first transfer transistor to transfer photo-generated charge from the first photosensitive region to the shared charge-to-voltage mechanism; and
   no more than partially enabling the second transfer transistor to partially turn on the second transfer transistor to increase a capacitance of the shared charge-to-voltage mechanism while the photo-generated charge is transferred from the first photosensitive region to the shared charge-to-voltage mechanism.

2. The method of claim 1, wherein no more than partially enabling the second transfer transistor to partially turn on the second transfer transistor includes applying a first voltage to a control terminal of the second transfer transistor, the method further comprising enabling the second transfer transistor by applying a second voltage to the control terminal of the second transfer transistor to transfer photo-generated charge from the second photosensitive region to the shared charge-to-voltage mechanism, wherein the first voltage is less than the second voltage.

3. The method of claim 2, wherein the second transfer transistor comprises a Metal-Oxide-Semiconductor Field-Effect Transistor (MOSFET), wherein the control terminal is a gate terminal of the MOSFET.

4. The method of claim 3, wherein the second voltage is greater than or equal to a threshold voltage of the MOSFET, and wherein the first voltage is less than the threshold voltage.

5. The method of claim 1, further comprising:
   enabling the second transfer transistor to transfer photo-generated charge from the second photosensitive region to the shared charge-to-voltage mechanism; and
   no more than partially enabling the first transfer transistor to partially turn on the first transfer transistor to increase the capacitance of the shared charge-to-voltage mechanism while the photo-generated charge is transferred from the second photosensitive region to the shared charge-to-voltage mechanism.

6. The method of claim 5, wherein the image sensor further comprises a reset transistor coupled between the shared charge-to-voltage mechanism and a reset voltage source, the method further comprising:
   enabling the reset transistor to apply a reset voltage to the shared charge-to-voltage mechanism prior to transferring the photo-generated charge from the first photosensitive region to the shared charge-to-voltage mechanism; and
   enabling the reset transistor to apply the reset voltage to the shared charge-to-voltage mechanism after transferring the photo-generated charge from the first photosensitive region to the shared charge-to-voltage mechanism and prior to transferring the photo-generated charge from the second photosensitive region to the charge-to-voltage mechanism.

7. The method of claim 1, wherein enabling the first transfer transistor to transfer photo-generated charge includes enabling the first transfer transistor for a first time period, and wherein no more than partially enabling the second transfer transistor to partially turn on the second transfer transistor includes partially enabling the second transfer transistor for a second time period, and wherein the first time period has a beginning that substantially coincides with a beginning of the second time period.

8. The method of claim 1, further comprising:
   disabling the first transfer transistor after at least some of the photo-generated charge is transferred to the shared charge-to-voltage mechanism; and
   disabling the second transfer transistor a delay time after disabling the first transfer transistor, such that the increased capacitance of the shared charge-to-voltage mechanism is maintained for the delay time after the first transfer transistor is disabled.

9. The method of claim 1, wherein the image sensor is a Complementary Metal-Oxide-Semiconductor (CMOS) image sensor, and wherein the first photosensitive region comprises a first photodiode and the second photosensitive region comprises a second photodiode.

10. A method for reading out an image sensor having a first photosensitive region, a second photosensitive region, a shared charge-to-voltage mechanism, a first transfer transistor disposed to selectively couple the first photosensitive region to the shared charge-to-voltage mechanism, a second transfer transistor disposed to selectively coupled the second photosensitive region to the shared charge-to-voltage mechanism, and a reset transistor coupled between the shared charge-to-voltage mechanism and a reset voltage source, the method comprising, in the following order:
   (a) enabling the reset transistor to reset the shared charge-to-voltage mechanism a first time;
   (b) enabling the first transfer transistor to transfer photo-generated charge from the first photosensitive region to the shared charge-to-voltage mechanism, and no more than partially enabling the second transfer transistor to partially turn on the second transfer transistor to increase a capacitance of the shared charge-to-voltage mechanism while the photo-generated charge is transferred from the first photosensitive region to the shared charge-to-voltage mechanism;
   (c) enabling the reset transistor to reset the shared charge-to-voltage mechanism a second time; and
   (d) enabling the second transfer transistor to transfer photo-generated charge from the second photosensitive region to the shared charge-to-voltage mechanism, and no more than partially enabling the first transfer transistor to partially turn on the first transfer transistor to increase the capacitance of the shared charge-to-voltage mechanism while the photo-generated charge is transferred from the second photosensitive region to the shared charge-to-voltage mechanism.

11. The method of claim 10, wherein,
   enabling the first transfer transistor in (a) comprises applying a first voltage to a control terminal of the first transfer transistor,
   enabling the second transfer transistor in (d) comprises applying the first voltage to a control terminal of the second transfer transistor,
   no more than partially enabling the second transfer transistor to partially turn on the second transfer transistor in (a) comprises applying a second voltage to the control terminal of the second transfer transistor, and
   no more than partially enabling the first transfer transistor to partially turn on the first transfer transistor in (d) comprises applying the second voltage to the control terminal of the first transfer transistor, wherein the second voltage is less than the first voltage.

12. The method of claim 11, wherein the first transfer transistor and the second transfer transistor each comprise a Metal-Oxide-Semiconductor Field-Effect Transistor (MOSFET).

13. The method of claim 12, wherein the first voltage is greater than or equal to a threshold voltage of the MOSFET and wherein the second voltage is less than the threshold voltage.

14. The method of claim 10, wherein enabling the first transfer transistor to transfer photo-generated charge includes enabling the first transfer transistor for a first time period, and wherein no more than partially enabling the second transfer transistor to partially turn on the second transfer transistor includes partially enabling the second transfer transistor for a second time period, and wherein the first time period has a beginning that substantially coincides with a beginning of the second time period.

15. The method of claim 10, wherein (b) further comprises:
  disabling the first transfer transistor after at least some of the photo-generated charge is transferred from the first photosensitive region to the shared charge-to-voltage mechanism; and
  disabling the second transfer transistor a delay time after disabling the first transfer transistor, such that the increased capacitance of the shared charge-to-voltage mechanism is maintained for the delay time after the first transfer transistor is disabled.

16. The method of claim 10, wherein the image sensor is a Complementary Metal-Oxide-Semiconductor (CMOS) image sensor, and wherein the first photosensitive region comprises a first photodiode and the second photosensitive region comprises a second photodiode.

17. A method for reading out an image sensor having an array of pixels units, each pixel unit including four photodiodes, four transfer transistors, and a shared charge-to-voltage mechanism, wherein each of the four transfer transistors are disposed to selectively couple a respective one of the four photodiodes to the shared charge-to-voltage mechanism, the method comprising:
  enabling a first of the four transfer transistors to transfer photo-generated charge from a first of the four photodiodes to the shared charge-to-voltage mechanism; and
  no more than partially enabling each of a second, third, and fourth of the four transfer transistors to partially turn on the second, third, and fourth transfer transistors of the four transfer transistors to increase a capacitance of the shared charge-to-voltage mechanism while the photo-generated charge is transferred from the first photodiode to the shared charge-to-voltage mechanism.

18. The method of claim 17, wherein enabling one of the four transfer transistors includes applying a first voltage to a control terminal of the transfer transistor, and wherein no more than partially enabling one of the four transfer transistors includes applying a second voltage to the control terminal, wherein the second voltage is less than the first voltage.

19. The method of claim 18, wherein each of the four transfer transistors each comprise a Metal-Oxide-Semiconductor Field-Effect Transistor (MOSFET), wherein the first voltage is equal to or greater than a threshold voltage of the MOSFET, and wherein the second voltage is less than the threshold voltage.

* * * * *